US012385983B2

(12) United States Patent
Xiao et al.

(10) Patent No.: US 12,385,983 B2
(45) Date of Patent: Aug. 12, 2025

(54) OPEN-CIRCUIT FAULT DIAGNOSIS METHOD FOR Si/SiC HYBRID H-BRIDGE INVERTER POWER DEVICE APPLICABLE TO GRID-SOURCE-STORAGE-VEHICHLE ENERGY MANAGEMENT SYSTEM

(71) Applicant: Hunan University, Changsha (CN)

(72) Inventors: Fan Xiao, Changsha (CN); Qi Guo, Changsha (CN); Yi Jiang, Changsha (CN); Xing Peng, Changsha (CN); Liu Long, Changsha (CN); Chunming Tu, Changsha (CN); Xin Wang, Changsha (CN); Zheng Lan, Changsha (CN)

(73) Assignee: Hunan University, Changsha (CN)

( * ) Notice: Subject to any disclaimer, the term of this patent is extended or adjusted under 35 U.S.C. 154(b) by 0 days.

(21) Appl. No.: 19/088,131

(22) Filed: Mar. 24, 2025

(65) Prior Publication Data
US 2025/0224459 A1 Jul. 10, 2025

(30) Foreign Application Priority Data
Jul. 22, 2024 (CN) .......................... 202410984276.1

(51) Int. Cl.
G01R 31/40 (2020.01)
G01R 19/165 (2006.01)

(52) U.S. Cl.
CPC ......... *G01R 31/40* (2013.01); *G01R 19/1659* (2013.01)

(58) Field of Classification Search
CPC ..................................................... G01R 31/40
See application file for complete search history.

(56) References Cited

U.S. PATENT DOCUMENTS

| 3,818,272 | A | * | 6/1974 | Rich | ..................... H02M 7/517 307/66 |
| 2014/0254223 | A1 | * | 9/2014 | Limpaecher | ........ H02M 7/4826 363/126 |
| 2016/0056151 | A1 | * | 2/2016 | Sheridan | ............ H03K 17/0822 257/76 |
| 2020/0292629 | A1 | * | 9/2020 | He | ......... H02M 7/537 |
| 2022/0198244 | A1 | * | 6/2022 | He | ......... G06F 18/214 |

FOREIGN PATENT DOCUMENTS

| CN | 114167303 | * | 3/2022 | ............. G01R 31/40 |
| CN | 114167303 | A | 3/2022 | |
| CN | 118033487 | A | 5/2024 | |

\* cited by examiner

*Primary Examiner* — Lisa M Caputo
*Assistant Examiner* — Sharah Zaab

(57) ABSTRACT

An open-circuit fault diagnosis method includes: S1, injecting a switching sequence into a second driving mode of the power device; S2, collecting inverter data and calculating a first output voltage residual; determining whether the first output voltage residual enters a voltage threshold region, and obtaining a first fault flag; if yes, proceeding to step S3; else proceeding to step S4; S3, injecting the switching sequence into an all-driving mode of the power device, collecting inverter data and calculating a second output voltage residual; determining whether the second output voltage residual enters the voltage threshold region, and obtaining a second fault flag; S4, collecting inverter data and calculating a first inductor current pulsation value; and determining whether the first inductor current pulsation value pulsates within an inductor current pulsation region, and obtaining a third fault flag; and S5, performing open-circuit fault diagnosis on the power device based on the fault flags.

10 Claims, 8 Drawing Sheets

OPEN-CIRCUIT FAULT DIAGNOSIS METHOD FOR Si/SiC HYBRID H-BRIDGE INVERTER POWER DEVICE APPLICABLE TO GRID-SOURCE-STORAGE-VEHICHLE ENERGY MANAGEMENT SYSTEM

CROSS-REFERENCE TO RELATED APPLICATIONS

This application claims priority to Chinese Patent Application No. 202410984276.1 with a filing date of Jul. 22, 2024. The content of the aforementioned application, including any intervening amendments thereto, is incorporated herein by reference.

TECHNICAL FIELD

The present disclosure relates to the technical field of fault diagnosis of electronic converters, and in particular, to an open-circuit fault diagnosis method for a silicon (Si)/silicon carbide (SiC) hybrid H-bridge inverter power device.

BACKGROUND

High-power inverters are widely used in the fields such as renewable energy generation, flexible alternating current transmission, and motor driving. A Si/SiC hybrid parallel switch structure has become one of the most competitive power devices among the high-power inverters by virtue of advantages such as high performance, high efficiency, and cost-effectiveness. A power device is a core part of the inverter, and an open-circuit fault of the power device may significantly impair the continuity and reliability of power supplied to equipment.

Currently, main diagnosis methods for the open-circuit fault of the power device of the inverter are classed into a current-based diagnosis method and a voltage-based diagnosis method. The current-based diagnosis method typically uses a phase current, neutral point current, or a current residual to detect the open-circuit fault. However, a Si/SiC hybrid device is typically driven by a new driving method, and involves more complicated current changes. The conventional current-based diagnosis method is not directly applicable to the Si/SiC hybrid device. The voltage-based diagnosis method is based on direct voltage measurement or pulse counting, thereby improving the response speed. However, most voltage-based diagnosis methods rely on an additional hardware circuit, thereby increasing cost. To achieve both speed and economic viability, a diagnosis method that constructs a voltage circuit model by considering a plurality of calculation errors has been put forward. However, the electrical quantities of a faulty hybrid device exhibit new forms and characteristics, and the fault symptoms are in a multi-coupled mapping relationship with the faulty devices. Consequently, the existing voltage model-based diagnosis method is not applicable to the Si/SiC hybrid inverter, and is unable to meet the requirements of reliable operation of the high-power inverter.

Therefore, a new technical solution is urgently needed to solve the technical problem that the existing open-circuit fault diagnosis method for the power device is hardly applicable to the Si/SiC hybrid inverter.

SUMMARY OF PRESENT INVENTION

The present disclosure provides an open-circuit fault diagnosis method for a Si/SiC hybrid H-bridge inverter power device to solve the technical problem that the existing open-circuit fault diagnosis method for the power device is hardly applicable to the Si/SiC hybrid inverter.

To achieve the above objective, the present disclosure provides an open-circuit fault diagnosis method for a Si/SiC hybrid H-bridge inverter power device, including the following steps:

S1, Injecting a first switching sequence into a second driving mode of the power device at intervals of a preset period, where the second driving mode includes a SiC metal-oxide-semiconductor field effect transistor (MOSFET) first-on and then-off mode;

S2, Collecting inverter data and calculating an output voltage residual to obtain a first output voltage residual; determining whether the first output voltage residual enters a voltage threshold diagnosis region, and obtaining a first fault flag; proceeding to step S3 when the first output voltage residual enters the voltage threshold diagnosis region, or, proceeding to step S4 when the first output voltage residual is outside the voltage threshold diagnosis region;

S3, Injecting the first switching sequence into an all-driving mode of the power device, collecting inverter data again and calculating an output voltage residual to obtain a second output voltage residual; determining whether the second output voltage residual enters the voltage threshold diagnosis region, and obtaining a second fault flag;

S4, Collecting inverter data and calculating an inductor current pulsation value to obtain a first inductor current pulsation value; and determining whether the first inductor current pulsation value pulsates within an inductor current pulsation region, and obtaining a third fault flag; and S5, Performing open-circuit fault diagnosis on the power device based on the first fault flag, the second fault flag, and the third fault flag.

Preferably, the step S1 includes:

the first switching sequence includes: turning on a SiC MOSFET during a Si insulated gate bipolar transistor (IGBT) on-and-off stage; and injecting the first switching sequence into the second driving mode of the power device at a frequency that the first switching sequence is injected in two switching cycles every N switching cycles, where 8≤N≤12, and N is a positive integer.

Preferably, the step S2 includes:

The collecting inverter data includes: collecting a reference modulation voltage $u_{ref}$, a load voltage $u_L$, a load current $i_L$, an inductor current $i_1$, a DC-side voltage $U_{dc}$, a switching cycle $T_s$, dead time $T_{DD}$, delay time $T_{DL}$, and inductor parameter $L_f$ of the inverter.

Preferably, the step S2 further includes:

using the following relation to represent the output voltage residual $\Delta u$:

$$\Delta u = u_{ref} - u_1/U_{dc}$$

wherein, $u_1$ represents an output voltage of an inverter port, and is expressed by the following relation:

$$u_1 = \frac{1}{T_s} \cdot \int_{t[n-1]}^{t[n]} \frac{di_L}{dt} \cdot L_f + u_L dt.$$

Preferably, the step S2 further includes: using the following relation to represent a simplified discrete form of $u_1$:

$$u_1 = \frac{1}{T_s} \cdot L_f \cdot (i_1[n] - i_1[n-1]) + \frac{1}{2} \cdot (u_L[n] + u_L[n-1])$$

wherein, $i_1[n]$ represents an inductor current at the $n^{th}$ sampling moment, $i_1[n-1]$ represents an inductor current at the $(n-1)^{th}$ sampling moment, $u_L[n]$ represents a load voltage at the $n^{th}$ sampling moment, and $u_L[n-1]$ represents a load voltage at the $(n-1)^{th}$ sampling moment.

Preferably, the step S2 further includes:
using the following relation to represent the output voltage residual $\Delta u$ in consideration of a calculation error caused by parameters and sampling in a process of calculating the output voltage residual:

$$\varepsilon_y = \sum_{i=0}^{i=n} \left| \frac{dy}{dx_i} \cdot \sigma_{xi} \right|$$

wherein, y represents a function value, $x_i$ represents a variable that causes a function change, $\sigma_{xi}$ represents an error of each variable $x_i$, and $\varepsilon_y$ represents a calculation error.

Preferably, the step S2 further includes: obtaining the calculation error $\varepsilon_1$ caused parameters and sampling in consideration of a sampling error value of a current and an inductor measurement error value in a model, and using the following relation to represent the calculation error:

$$\varepsilon_1 = \frac{1}{T_s} \cdot \sigma_{Lf} \cdot (|i_1[n] - i_1[n-1]|) + \sigma_{uL} + \sigma_{iL} + \sigma_{i1}$$

wherein, $\sigma_{Lf}$ represents a maximum error at time of selecting an inductance; $\sigma_{i1}$, $\sigma_{uL}$, and $\sigma_{iL}$ represent maximum sampling errors of an inductor current $i_1$, a load voltage $u_L$, and a load current $i_L$, respectively; $i_1[n]$ represents an inductor current at the $n^{th}$ sampling moment; and $i_1[n-1]$ represents an inductor current at the $(n-1)^{th}$ sampling moment.

Preferably, the step S2 further includes: using the following relation to represent a calculation error $\varepsilon_2$ caused by a dead zone and a delay:

$$\varepsilon_2 = 2U_{dc} \cdot \frac{T_{DD}}{T_s} + 2U_{dc} \cdot \frac{T_{DL}}{T_s}$$

wherein, $U_{dc}$ represents a direct-current-side voltage, $T_S$ represents a switching frequency, $T_{DD}$ represents a dead time, and $T_{DL}$ represents a delay time.

Preferably, the method further includes:
using the following relation to represent the voltage threshold diagnosis region:

$$\begin{cases} \Delta u_{detect1} \in [u_{ref1} - \varepsilon_1 - \varepsilon_2, u_{ref1} + \varepsilon_1 + \varepsilon_2] \\ \Delta u_{detect2} \in [u_{ref2} - \varepsilon_1 - \varepsilon_2, u_{ref2} + \varepsilon_1 + \varepsilon_2] \end{cases}$$

wherein, $u_{ref1}$ represents an upper half wave of a reference voltage; $u_{ref2}$ represents a lower half wave of the reference voltage; $\Delta u_{detect1}$ represents a first threshold detection region, and $\Delta u_{detect1}$ represents a second threshold detection region.

Preferably, the method further includes:
The determining whether the first output voltage residual enters a voltage threshold diagnosis region in the step S2 includes:
setting the first fault flag $F_a$ to 1 when the output voltage residual $\Delta u$ enters the first threshold detection region;
setting the first fault flag $F_a$ to $-1$ when the output voltage residual $\Delta u$ enters the second threshold detection region; and
setting the first fault flag $F_a$ to 0 when the output voltage residual $\Delta u$ enters neither the first threshold detection region nor the second threshold detection region.

The determining whether the second output voltage residual enters a voltage threshold diagnosis region in the step S3 includes:
setting the second fault flag $F_b$ to 1 when the output voltage residual $\Delta u$ enters the first threshold detection region;
setting the second fault flag $F_b$ to $-1$ when the output voltage residual $\Delta u$ enters the second threshold detection region; and
setting the second fault flag $F_b$ to 0 when the output voltage residual $\Delta u$ enters neither the first threshold detection region nor the second threshold detection region.

A corresponding fault flag is empty when no corresponding determining process is performed.

Preferably, the step S4 includes:
using the following relation to represent the inductor current pulsation value $\Delta i_{km}$:

$$\Delta i_{km} = \frac{U_{dc} - u_{ref} \cdot U_{dc}}{L_f} \cdot u_{ref} \cdot T_s$$

obtaining the inductor current pulsation region $\Delta i_{detect}$ in consideration of the calculation error $\varepsilon_1$ caused by parameters and sampling as well as the calculation error $\varepsilon_2$ caused by a dead zone and a delay, and using the following relation to represent the inductor current pulsation region:

$$\Delta i_{detect} \in [i_L - \Delta i_{km} - \varepsilon_1 - \varepsilon_2, i_L + \Delta i_{km} + \varepsilon_1 + \varepsilon_2].$$

Preferably, the determining whether the first inductor current pulsation value pulsates within an inductor current pulsation region in the step S4 includes:
setting the third fault flag $F_c$ to 1 when the inductor current departs from $\Delta i_{detect}$ and is greater than 0;
setting the third fault flag $F_c$ to $-1$ when the inductor current departs from $\Delta i_{detect}$ and is less than 0; and
setting the third fault flag $F_c$ to 0 when the inductor current keeps within the $\Delta i_{detect}$ range.

A corresponding fault flag is empty when no corresponding determining process is performed.

Preferably, the step S5 includes:
performing positioning of a specific faulty fully-controlled device to obtain specific fault information based on different value combinations of the first fault flag, the second fault flag, and the third fault flag.

The present disclosure achieves at least the following beneficial effects:
The open-circuit fault diagnosis method for the Si/SiC hybrid H-bridge inverter power device according to the present disclosure uses the inverter output voltage residual and the inductor current pulsation value as diagnosis variables, without a need to add additional sensors, thereby reducing cost. The fault characteristics are amplified by calculating the voltage residual and the inductor current pulsation value. At the moment of the fault occurrence, the diagnosis variable changes significantly in a working range of the faulty switch transiently. In this way, the method provides a reliable dynamic indicator to ensure the diagnosis speed of the algorithm. By quantitatively analyzing the relationship between the voltage residual and the detection threshold in a case of an open-circuit fault of the device, the present disclosure implements accurate positioning of the faulty power device. The method of the present disclosure is applicable to Si/SiC hybrid inverters, and provides a reliable fault diagnosis method for the Si/SiC hybrid inverters.

The present disclosure also achieves other objectives, features, and advantages in addition to the objectives, features, and advantages described above. The following describes the present disclosure in further detail with reference to accompanying drawings.

BRIEF DESCRIPTION OF THE DRAWINGS

The drawings that constitute a part of the present disclosure are intended to enable a further understanding of the present disclosure. The exemplary embodiments of the present disclosure and the description thereof are intended to explain the present disclosure but without constituting any undue limitation on the present disclosure. In the drawings.

DETAILED DESCRIPTION OF THE EMBODIMENTS

The embodiments of the present disclosure are described in detail below with reference to accompanying drawings, but the present disclosure may be implemented in many different ways as defined and covered by the claims.

Figure 1:
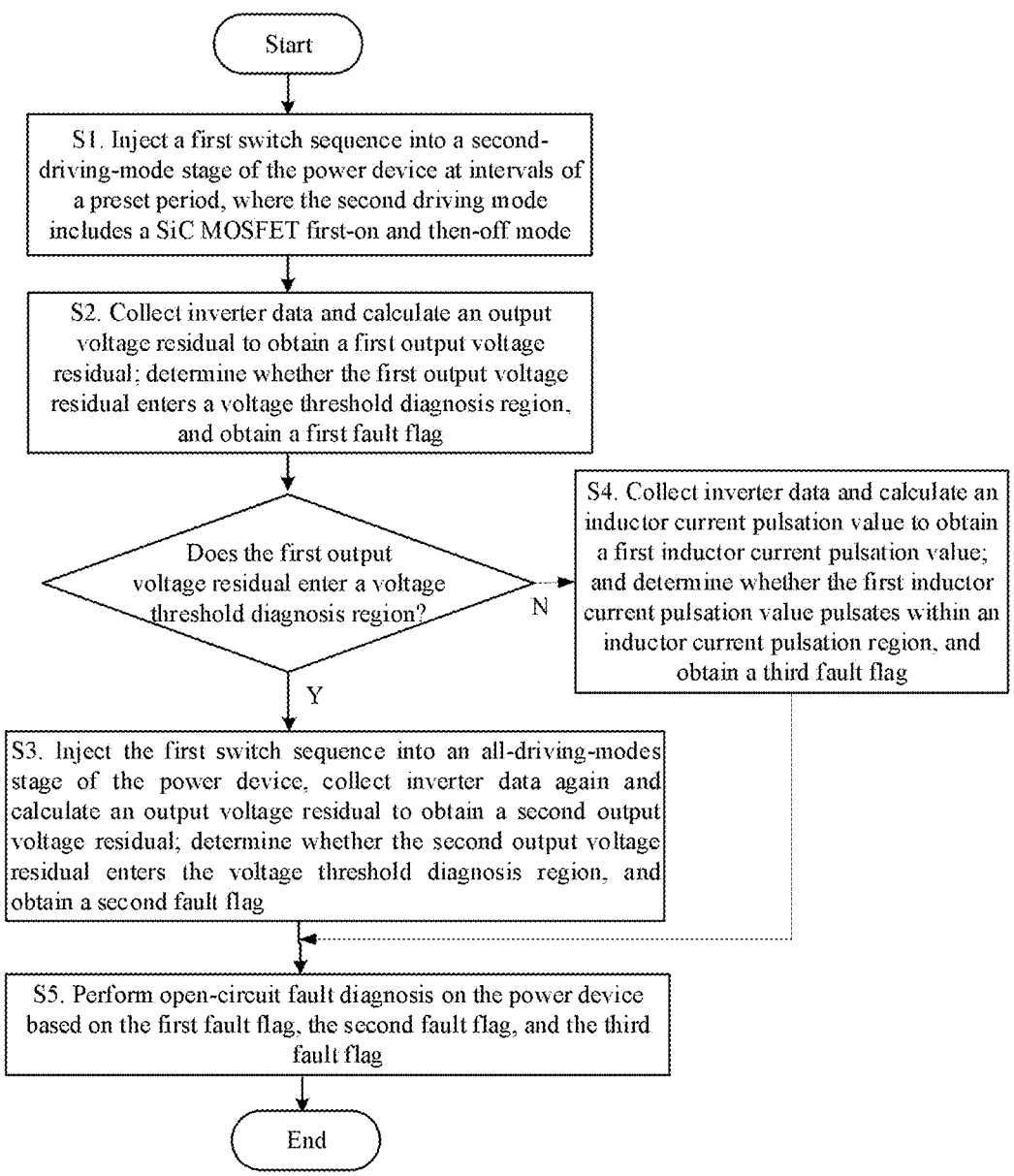
FIG. 1 is a schematic flowchart of a preferred embodiment of the present disclosure.

Referring to FIG. 1, in a preferred embodiment of the present disclosure, an open-circuit fault diagnosis method for a Si/SiC hybrid H-bridge inverter power device is provided, including the following steps.

In step S1, a first switching sequence is injected into a second driving mode of the power device at intervals of a preset period. The second driving mode includes a SiC MOSFET first-on and then-off mode. Step S1 specifically includes the following substeps.

Figure 2:
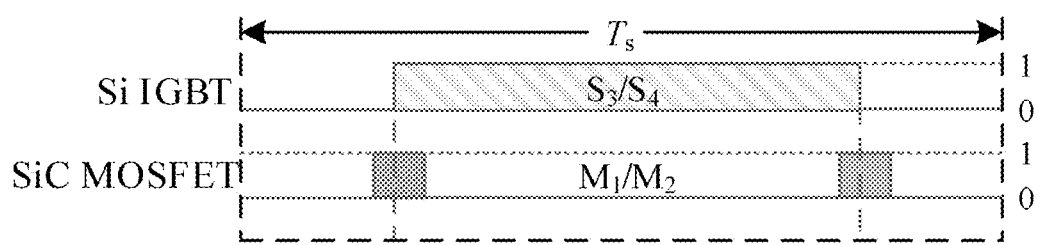
FIG. 2 is a schematic diagram of a fault diagnosis switching sequence according to a preferred embodiment of the present disclosure.

Referring to FIG. 2, the fault diagnosis switching sequence, that is, the first switching sequence, includes: turning on the SiC MOSFET in a Si IGBT on-and-off stage to bear the switching loss.

The first switching sequence is injected into the second driving mode of the power device at a frequency that the first switching sequence is injected in two switching cycles every N switching cycles, where 8≤N≤12, and N is a positive integer.

In a preferred embodiment of the present disclosure, on the premise of ensuring normal operation of the inverter, the periodic injection of the first switching sequence is conducive to distinguishing similar characteristics of the open-circuit fault of the power device, thereby improving the reliability of the diagnosis strategy.

In step S2, inverter data is collected, and an output voltage residual is calculated to obtain a first output voltage residual. It is determined whether the first output voltage residual enters a voltage threshold diagnosis region, and a first fault flag is obtained. The process goes to step S3 when the first output voltage residual enters the voltage threshold diagnosis region, or, the process goes to step S4 when the first output voltage residual is outside the voltage threshold diagnosis region. The step S2 specifically includes the following substeps.

The step of collecting inverter data includes: collecting a reference modulation voltage $u_{ref}$, a load voltage $u_L$, a load current $i_L$, an inductor current $i_1$, a DC-side voltage $U_{dc}$, a switching cycle $T_s$, dead time $T_{DD}$, delay time $T_{DL}$, and inductor parameter $L_f$ of the inverter.

Figure 3:
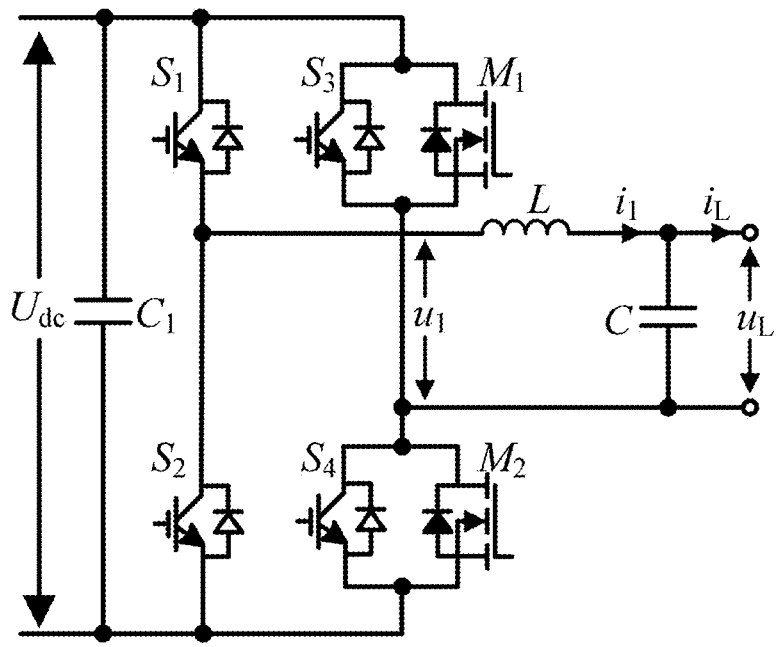
FIG. 3 is a schematic diagram of a Si/SiC hybrid H-bridge inverter according to a preferred embodiment of the present disclosure.

In a preferred embodiment of the present disclosure, the Si/SiC hybrid H-bridge inverter structure and the inverter data are shown in FIG. 3.

The output voltage residual $\Delta u$ may be represented by the following relation:

$$\Delta u = u_{ref} - u_1/U_{dc}$$

wherein, $u_1$ represents an output voltage of an inverter port, and is expressed by the following relation:

$$u_1 = \frac{1}{T_s} \cdot \int_{t[n-1]}^{t[n]} \frac{di_L}{dt} \cdot L_f + u_L dt.$$

The following relation is used for representing a simplified discrete form of $u_1$:

$$u_1 = \frac{1}{T_s} \cdot L_f \cdot (i_1[n] - i_1[n-1]) + \frac{1}{2} \cdot (u_L[n] + u_L[n-1])$$

wherein, $i_1[n]$ represents an inductor current at the $n^{th}$ sampling moment, $i_1[n-1]$ represents an inductor current at the $(n-1)^{th}$ sampling moment, $u_L[n]$ represents a load voltage at the $n^{th}$ sampling moment, and $u_L[n-1]$ represents a load voltage at the $(n-1)^{th}$ sampling moment.

The following relation is used for representing the output voltage residual $\Delta u$ in consideration of a calculation error caused by parameters and sampling in a process of calculating the output voltage residual:

$$\varepsilon_y = \sum_{i=0}^{i=n} \left| \frac{dy}{dx_i} \cdot \sigma_{xi} \right|$$

wherein, y represents a function value, $x_i$ represents a variable that causes a function change, $\sigma_{xi}$ represents an error of each variable $x_i$, and $\varepsilon_y$ represents a calculation error.

The calculation error $\varepsilon_1$ caused parameters and sampling is obtained in consideration of a sampling error value of a current and an inductor measurement error value in a model, and the following relation is used for representing the calculation error:

$$\varepsilon_1 = \frac{1}{T_s} \cdot \sigma_{Lf} \cdot (|i_1[n] - i_1[n-1]|) + \sigma_{u_L} + \sigma_{i_L} + \sigma_{i_1}$$

wherein, $\sigma_{Lf}$ represents a maximum error at time of selecting an inductance; $\sigma_{i1}$, $\sigma_{uL}$, and $\sigma_{iL}$ represent maximum sampling errors of an inductor current $i_1$, a load voltage $u_L$, and a load current $i_L$, respectively; $i_1[n]$ represents an inductor current at the $n^{th}$ sampling moment; and $i_1[n-1]$ represents an inductor current at the $(n-1)^{th}$ sampling moment.

The following relation is used for representing a calculation error $\varepsilon_2$ caused by a dead zone and a delay:

$$\varepsilon_2 = 2U_{dc} \cdot \frac{T_{DD}}{T_s} + 2U_{dc} \cdot \frac{T_{DL}}{T_s}$$

wherein, $U_{dc}$ represents a direct-current-side voltage, $T_S$ represents a switching frequency, $T_{DD}$ represents a dead time, and $T_{DL}$ represents a delay time.

In a preferred embodiment of the present disclosure, the calculation errors caused by sampling, parameters, dead zones, and delays are considered, and an adaptive threshold diagnosis region is designed, thereby eliminating the modeling errors caused by the establishment of a voltage residual model and further improving the accuracy of the diagnosis strategy.

The voltage threshold diagnosis region may be represented by the following relation:

$$\begin{cases} \Delta u_{detect1} \in [u_{ref1} - \varepsilon_1 - \varepsilon_2, u_{ref1} + \varepsilon_1 + \varepsilon_2] \\ \Delta u_{detect2} \in [u_{ref2} - \varepsilon_1 - \varepsilon_2, u_{ref2} + \varepsilon_1 + \varepsilon_2] \end{cases}$$

wherein, $u_{ref1}$ represents an upper half wave of a reference voltage; $u_{ref2}$ represents a lower half wave of the reference voltage; $\Delta u_{detect1}$ represents a first threshold detection region, and $\Delta u_{detect1}$ represents a second threshold detection region.

The step of determining whether the first output voltage residual enters a voltage threshold diagnosis region in the step S2 includes the following substeps:
The first fault flag $F_a$ is set to 1 when the output voltage residual $\Delta u$ enters the first threshold detection region;
The first fault flag $F_a$ is set to $-1$ when the output voltage residual $\Delta u$ enters the second threshold detection region; and
The first fault flag $F_a$ is set to 0 when the output voltage residual $\Delta u$ enters neither the first threshold detection region nor the second threshold detection region.

In step S3, the first switching sequence is injected into an all-driving mode of the power device. Inverter data is collected again, and an output voltage residual is calculated to obtain a second output voltage residual. It is determined whether the second output voltage residual enters the voltage threshold diagnosis region, and a second fault flag is obtained.

Figure 4:
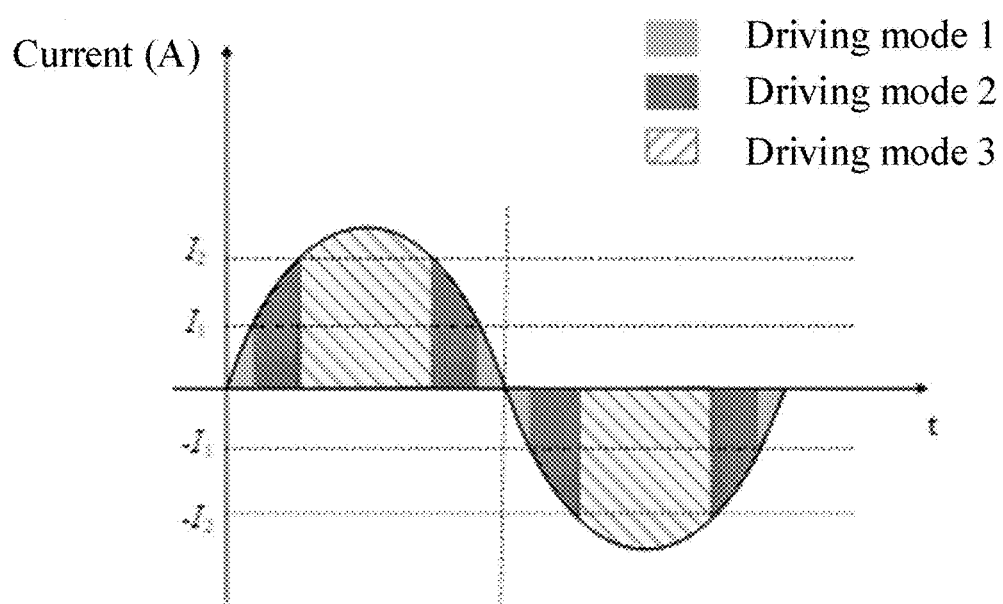
FIG. 4 is a schematic diagram of a current-dependent driving mode of a power device according to a preferred embodiment of the present disclosure.

Referring to FIG. 4, in the Si/SiC hybrid H-bridge inverter power device according to a preferred embodiment of the present disclosure, the driving mode is current-dependent. In FIG. 4, $I_1$ and $I_2$ are driving-mode operating current values, satisfying: $0<I_1<I_2$. The all-driving mode for the Si/SiC hybrid device part includes a first driving mode, a second driving mode, and a third driving mode, as described in detail below:

First driving mode: When the current falls within the range of 0 to $I_1$, the SiC MOSFET is turned on alone.

Second driving mode: When the current falls within the range of $I_1$ to $I_2$, the SiC MOSFET is turned on and then off.

Third driving mode: When the current is greater than $I_2$, the Si IGBT is turned on and then off.

In a preferred embodiment of the present disclosure, some power devices generate similar voltage residual characteristics after occurrence of an open-circuit fault. It is difficult to precisely locate the faulty power device based on the first output voltage residual alone. To further locate the power device with an open-circuit fault, the first switching sequence is injected into the all-driving mode of the power device to improve the accuracy of the diagnosis strategy.

The step of determining whether the second output voltage residual enters a voltage threshold diagnosis region in the step S3 includes the following substeps:
The second fault flag $F_b$ is set to 1 when the output voltage residual $\Delta u$ enters the first threshold detection region;
The second fault flag $F_b$ is set to $-1$ when the output voltage residual $\Delta u$ enters the second threshold detection region; and
The second fault flag $F_b$ is set to 0 when the output voltage residual $\Delta u$ enters neither the first threshold detection region nor the second threshold detection region.

A corresponding fault flag is empty when no corresponding determining process is performed.

In the step S4, inverter data is collected and an inductor current pulsation value is calculated to obtain a first inductor current pulsation value. It is determined whether the first inductor current pulsation value pulsates within an inductor current pulsation region, and a third fault flag is obtained. Step S4 specifically includes the following substeps:

The following relation is used for representing the inductor current pulsation value $\Delta i_{km}$:

$$\Delta i_{km} = \frac{U_{dc} - u_{ref} \cdot U_{dc}}{L_f} \cdot u_{ref} \cdot T_s.$$

The inductor current pulsation region $\Delta i_{detect}$ is obtained in consideration of the calculation error $\varepsilon_1$ caused by parameters and sampling as well as the calculation error $\varepsilon_2$ caused by a dead zone and a delay, and using the following relation to represent the inductor current pulsation region:

$$\Delta i_{detect} \in [i_L - \Delta i_{km} - \varepsilon_1 - \varepsilon_2, i_L + \Delta i_{km} + \varepsilon_1 + \varepsilon_2]$$

In a preferred embodiment of the present disclosure, the pulsation value of the inductor current under normal working conditions may be estimated by the above formula, thereby constructing an inductor current pulsation region, indicating that the inductor current fluctuates within the region under normal conditions. After an open-circuit fault occurs, due to abnormal charging and discharging of the inductor, the inductor pulsation will depart from the pulsation region, thereby enabling fault diagnosis.

The step of determining whether the first inductor current pulsation value pulsates within an inductor current pulsation region in the step S4 includes the following substeps:

The third fault flag $F_c$ is set to 1 when the inductor current departs from $\Delta i_{detect}$ and is greater than 0;

The third fault flag $F_c$ is set to −1 when the inductor current departs from $\Delta i_{detect}$ and is less than 0; and The third fault flag $F_c$ is set to 0 when the inductor current keeps within the $\Delta i_{detect}$ range.

A corresponding fault flag is empty when no corresponding determining process is performed.

In S5, open-circuit fault diagnosis is performed on the power device based on the first fault flag, the second fault flag, and the third fault flag. Step S5 specifically includes the following substep:

Positioning of a specific faulty fully-controlled device is performed to obtain specific fault information based on different value combinations of the first fault flag, the second fault flag, and the third fault flag, as shown in Table 1.

TABLE 1

Criteria for determining and locating a faulty fully-controlled device

| F a | F b | F c | Faulty fully-controlled device |
|---|---|---|---|
| 1 | 1 | — | S1 (Si IGBT in a single device) |
| — | — | — | S2 (Si IGBT in a single device) |
| 1 | 1 | — | |
| 0 | — | 1 | S3 (Si IGBT in a hybrid device) |
| 0 | — | 1 | S4 (Si IGBT in a hybrid device) |
| −1 | 0 | — | M1 (SiC MOSFET in a hybrid device) |
| 1 | 0 | — | M2 (SiC MOSFET in a hybrid device) |

Verification Part

To better demonstrate the effectiveness of the fully-controlled device fault diagnosis method disclosed herein, a Si/SiC hybrid H-bridge inverter model is built in MATLAB/Simulink. The injection of the power device switch signal is stopped at a specified moment to simulate the open-circuit fault of the power device, so as to simulate the diagnosis of the open-circuit fault of the relevant fully-controlled device. Table 2 shows the specific circuit simulation parameters.

TABLE 2

Main circuit simulation parameters

| Parameter | Value | Parameter | Value |
|---|---|---|---|
| DC-side voltage $U_{dc}$ (V) | 600 | Filter inductance L (mH) | 6 |
| Power grid frequency $f_g$ (Hz) | 50 | Filter capacitance C (μF) | 20 |
| DC-side capacitance $C_1$, $C_2$ (μF) | 2300 | Rated power of inverter $P_{inv}$ (kW) | 10 |
| Dead time $T_{DD}$ (μs) | 2 | Switching/sampling frequency $f_s$ (kHz) | 10 |

Figure 5:
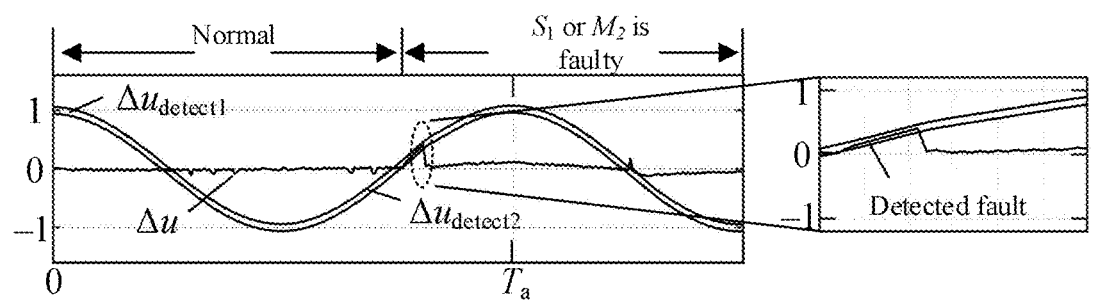
FIG. 5 is a schematic diagram of determining a first output voltage residual in locating a faulty device $M_2$ according to a preferred embodiment of the present disclosure.
Figure 6:
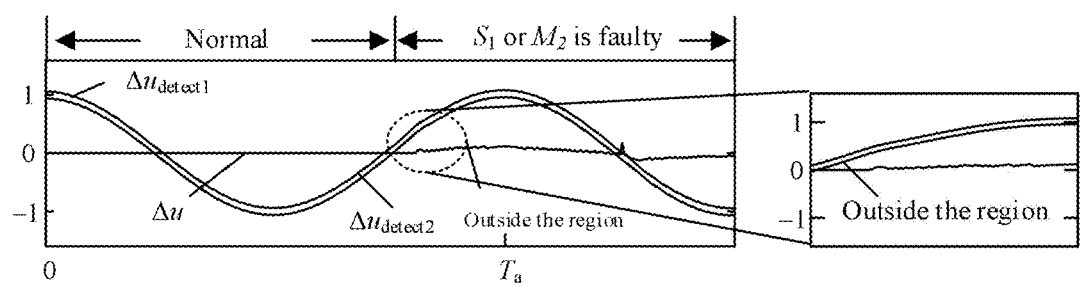
FIG. 6 is a schematic diagram of detecting an inductor current pulsation value in locating a faulty device $M_2$ according to a preferred embodiment of the present disclosure.

Referring to FIG. 5 and FIG. 6, in an example in which a power switch $M_2$ incurs an open-circuit fault, a residual $\Delta u$ is generated between the inverter output voltage and the reference voltage. The residual $\Delta u$ enters the voltage threshold diagnosis region $\Delta u_{detect1}$ at a moment during operation of the faulty transistor. The diagnosis variable $F_a$ is set to 1. It is preliminarily determined that the faulty power device is $S_1$ or $M_2$. Subsequently, the driving mode is switched to a fault diagnosis switching sequence. It is determined for a second time whether the residual $\Delta u$ enters the threshold region $\Delta u_{detect1}$. As can be seen from FIG. 5 to FIG. 6, when $M_1$ is faulty, the residual will not enter the diagnosis threshold region again. The diagnosis variable $F_b$ is set to 0. At this time, the criteria for determining and locating the fault of the power switch $M_2$ are met, and the faulty device $M_2$ is identified.

Figure 7:
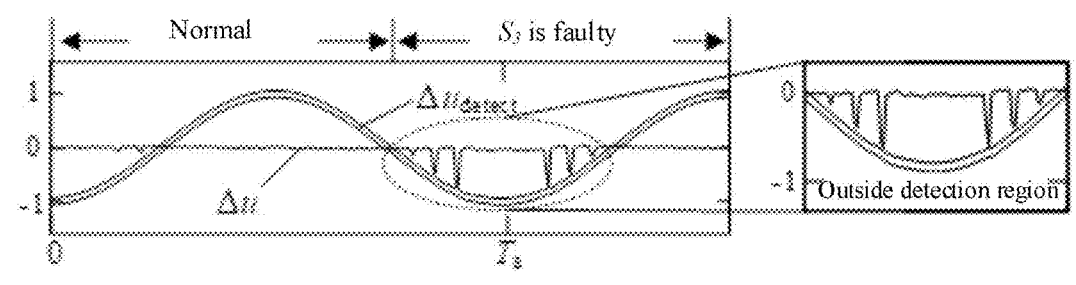
FIG. 7 is a schematic diagram of determining a first output voltage residual in locating a faulty device $S_3$ according to a preferred embodiment of the present disclosure.
Figure 8:
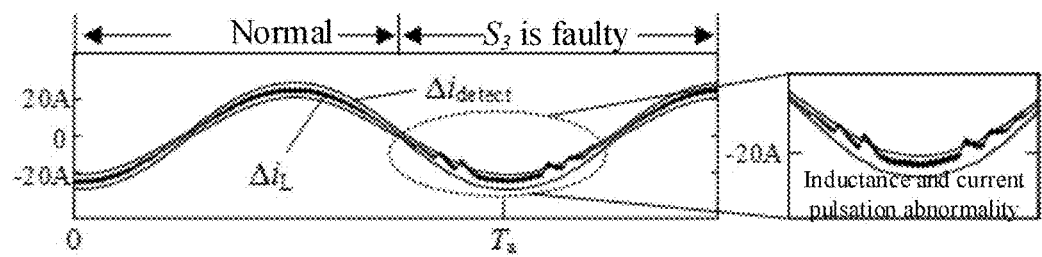
FIG. 8 is a schematic diagram of detecting an inductor current pulsation value in locating a faulty device $S_3$ according to a preferred embodiment of the present disclosure.

Referring to FIG. 7 and FIG. 8, still in the example in which the power switch $S_3$ incurs an open-circuit fault, the voltage residual $\Delta u$ will not enter the voltage threshold diagnosis interval $\Delta u_{detect}$ after occurrence of the fault, and the diagnosis variable $F_a$ is always 0. Further, an inductor current pulsation value is determined. The inductor current $\Delta i_L$ in the operating interval of the faulty switch in driving mode 2 is distorted, thereby departing from the normal inductor current pulsation interval $\Delta i_{detect}$. The diagnosis variable $F_c$ is set to −1. In this way, the faulty switch $S_3$ is located precisely. As can be seen, this technical solution is effective.

The open-circuit fault diagnosis method for the Si/SiC hybrid H-bridge inverter power device according to a preferred embodiment of the present disclosure uses the inverter output voltage residual and the inductor current pulsation value as diagnosis variables, without a need to add additional sensors, thereby reducing cost. The fault characteristics are amplified by calculating the voltage residual and the inductor current pulsation value. At the moment of the fault occurrence, the diagnosis variable changes significantly in a working range of the faulty switch transiently. In this way, the method provides a reliable dynamic indicator to ensure the diagnosis speed of the algorithm. By quantitatively analyzing the relationship between the voltage residual and the detection threshold in a case of an open-circuit fault of the device, the present disclosure implements accurate positioning of the faulty power device. The method of the present disclosure is applicable to Si/SiC hybrid inverters, and provides a reliable fault diagnosis method for the Si/SiC hybrid inverters.

What is described above is merely exemplary embodiments of the present disclosure, but is not intended to limit the present disclosure. To a person skilled in the art, various modifications and variations may be made to the present disclosure. Any and all modifications, equivalent replacements, improvements, and the like made without departing from the essence and principles of the present disclosure still fall within the protection scope of the present disclosure.

What is claimed is:

1. An open-circuit fault diagnosis method for a silicon (Si)/silicon carbide (SiC) hybrid H-bridge inverter power device, comprising the following steps:

S1, injecting a first switching sequence into a second driving mode of the power device at intervals of a preset period, wherein the second driving mode comprises a SiC metal-oxide-semiconductor field effect transistor (MOSFET) first-on and then-off mode;

S2, collecting inverter data and calculating an output voltage residual to obtain a first output voltage residual; determining whether the first output voltage residual enters a voltage threshold diagnosis region, and obtaining a first fault flag; proceeding to step S3 when the first output voltage residual enters the voltage threshold diagnosis region, or, proceeding to step S4 when the first output voltage residual is outside the voltage threshold diagnosis region;

S3, injecting the first switching sequence into an all-driving mode of the power device, collecting inverter data again and calculating an output voltage residual to obtain a second output voltage residual; determining whether the second output voltage residual enters the voltage threshold diagnosis region, and obtaining a second fault flag;

S4, collecting inverter data and calculating an inductor current pulsation value to obtain a first inductor current pulsation value; and determining whether the first inductor current pulsation value pulsates within an inductor current pulsation region, and obtaining a third fault flag; and S5, performing open-circuit fault diagnosis on the power device based on the first fault flag, the second fault flag, and the third fault flag.

2. The open-circuit fault diagnosis method according to claim 1, wherein in the step S1:
the first switching sequence comprises: turning on a SiC MOSFET during a Si insulated gate bipolar transistor (IGBT) on-and-off stage; and
injecting the first switching sequence into the second driving mode of the power device at a frequency that the first switching sequence is injected in two switching cycles every N switching cycles, wherein 8≤N≤12, and N is a positive integer.

3. The open-circuit fault diagnosis method according to claim 2, wherein in the step S2:
the collecting inverter data comprises: collecting a reference modulation voltage $u_{ref}$, a load voltage $u_L$, a load current $i_L$, an inductor current $i_1$, a direct-current-side voltage $U_{dc}$, a switching cycle $T_s$, a dead time $T_{DD}$, a delay time $T_{DL}$, and an inductor parameter $L_f$ of the inverter.

4. The open-circuit fault diagnosis method according to claim 3, wherein the step S2 further comprises:
using the following relation to represent the output voltage residual $\Delta u$:

$$\Delta u = u_{ref} - u_1/U_{dc}$$

wherein, $u_1$ represents an output voltage of an inverter port, and is expressed by the following relation:

$$u_1 = \frac{1}{T_s} \cdot \int_{t[n-1]}^{t[n]} \frac{di_L}{dt} \cdot L_f + u_L dt;$$

using the following relation to represent a simplified discrete form of $u_1$:

$$u_1 = \frac{1}{T_s} \cdot L_f \cdot (i_1[n] - i_1[n-1]) + \frac{1}{2} \cdot (u_L[n] + u_L[n-1])$$

wherein, $t[n]$ represents an $n^{th}$ sampling moment, $t[n-1]$ represents an $(n-1)^{th}$ sampling moment, t represents a sampling moment, $i_1[n]$ represents an inductor current at the $n^{th}$ sampling moment, $i_1[n-1]$ represents an inductor current at the $(n-1)^{th}$ sampling moment, $u_L[n]$ represents a load voltage at the $n^{th}$ sampling moment, and $u_L[n-1]$ represents a load voltage at the $(n-1)^{th}$ sampling moment.

5. The open-circuit fault diagnosis method according to claim 4, wherein the step S2 further comprises:
using the following relation to represent the output voltage residual $\Delta u$ in consideration of a calculation error caused by parameters and sampling in a process of calculating the output voltage residual:

$$\varepsilon_y = \sum_{i=0}^{i=n} \left| \frac{dy}{dx_i} \cdot \sigma_{xi} \right|$$

wherein, y represents a function value, $x_i$ represents a variable that causes a function change, $\sigma_{xi}$ represents an error of each variable $x_i$, and $\varepsilon_y$ represents a calculation error;
obtaining the calculation error $\varepsilon_1$ caused parameters and sampling in consideration of a sampling error value of a current and an inductor measurement error value in a model, and using the following relation to represent the calculation error:

$$\varepsilon_1 = \frac{1}{T_s} \cdot \sigma_{Lf} \cdot (|i_1[n] - i_1[n-1]|) + \sigma_{u_L} + \sigma_{i_L} + \sigma_{i_1}$$

wherein, $\sigma_{Lf}$ represents a maximum error at time of selecting an inductance; $\sigma_{i1}$, $\sigma_{uL}$, and $\sigma_{iL}$ represent maximum sampling errors of an inductor current $i_1$, a load voltage $u_L$, and a load current $i_L$, respectively; $i_1[n]$ represents an inductor current at the $n^{th}$ sampling moment; and $i_1[n-1]$ represents an inductor current at the $(n-1)^{th}$ sampling moment; and
using the following relation to represent a calculation error $\varepsilon_2$ caused by a dead zone and a delay:

$$\varepsilon_2 = 2U_{dc} \cdot \frac{T_{DD}}{T_s} + 2U_{dc} \cdot \frac{T_{DL}}{T_s}$$

wherein, $U_{dc}$ represents a direct-current-side voltage, $T_{DD}$ represents a dead time, and $T_{DL}$ represents a delay time.

6. The open-circuit fault diagnosis method according to claim 5, further comprising:
using the following relation to represent the voltage threshold diagnosis region:

$$\begin{cases} \Delta u_{detect1} \in [u_{ref1} - \varepsilon_1 - \varepsilon_2, u_{ref1} + \varepsilon_1 + \varepsilon_2] \\ \Delta u_{detect2} \in [u_{ref2} - \varepsilon_1 - \varepsilon_2, u_{ref2} + \varepsilon_1 + \varepsilon_2] \end{cases}$$

wherein, $u_{ref1}$ represents an upper half wave of a reference voltage; $u_{ref2}$ represents a lower half wave of the reference voltage; $\Delta u_{detect1}$ represents a first threshold detection region, and $\Delta u_{detect2}$ represents a second threshold detection region.

7. The open-circuit fault diagnosis method according to claim 6, wherein
the determining whether the first output voltage residual enters a voltage threshold diagnosis region in the step S2 comprises:
setting the first fault flag $F_a$ to 1 when the output voltage residual $\Delta u$ enters the first threshold detection region;

setting the first fault flag $F_a$ to −1 when the output voltage residual Δu enters the second threshold detection region; and setting the first fault flag $F_a$ to 0 when the output voltage residual Δu enters neither the first threshold detection region nor the second threshold detection region; and the determining whether the second output voltage residual enters a voltage threshold diagnosis region in the step S3 comprises:

setting the second fault flag $F_b$ to 1 when the output voltage residual Δu enters the first threshold detection region;

setting the second fault flag $F_b$ to −1 when the output voltage residual Δu enters the second threshold detection region; and setting the second fault flag $F_b$ to 0 when the output voltage residual Δu enters neither the first threshold detection region nor the second threshold detection region, wherein a corresponding fault flag is empty when no corresponding determining process is performed.

8. The open-circuit fault diagnosis method according to claim 7, wherein the step S4 comprises:

using the following relation to represent the inductor current pulsation value $\Delta i_{km}$:

$$\Delta i_{km} = \frac{U_{dc} - u_{ref} \cdot U_{dc}}{L_f} \cdot u_{ref} \cdot T_s,$$

and obtaining the inductor current pulsation region $\Delta i_{detect}$ in consideration of the calculation error $\varepsilon_1$ caused by parameters and sampling as well as the calculation error $\varepsilon_2$ caused by a dead zone and a delay, and using the following relation to represent the inductor current pulsation region:

$$\Delta i_{detect} \in [i_L - \Delta i_{km} - \varepsilon_1 - \varepsilon_2, i_L + \Delta i_{km} + \varepsilon_1 + \varepsilon_2].$$

9. The open-circuit fault diagnosis method according to claim 8, wherein the determining whether the first inductor current pulsation value pulsates within an inductor current pulsation region in the step S4 comprises:

setting the third fault flag $F_c$ to 1 when the inductor current departs from $\Delta i_{detect}$ and is greater than 0;

setting the third fault flag $F_c$ to −1 when the inductor current departs from $\Delta i_{detect}$ and is less than 0; and setting the third fault flag $F_c$ to 0 when the inductor current keeps within the $\Delta i_{detect}$ range, wherein a corresponding fault flag is empty when no corresponding determining process is performed.

10. The open-circuit fault diagnosis method according to claim 1, wherein the step S5 comprises:

performing positioning of a specific faulty fully-controlled device to obtain specific fault information based on different value combinations of the first fault flag, the second fault flag, and the third fault flag.

\* \* \* \* \*